United States Patent [19]

Lish

[11] Patent Number: 4,697,153

[45] Date of Patent: Sep. 29, 1987

[54] CASCODE AUTO BIAS CIRCUIT

[75] Inventor: Charles A. Lish, Holbrook, N.Y.

[73] Assignee: Standard Microsystems Corp., Hauppauge, N.Y.

[21] Appl. No.: 908,651

[22] Filed: Sep. 18, 1986

[51] Int. Cl.$^4$ .............................................. H03F 3/16
[52] U.S. Cl. .................................. 330/277; 330/288; 330/296; 330/311
[58] Field of Search ............... 330/277, 288, 296, 311; 323/315, 316

[56] References Cited

FOREIGN PATENT DOCUMENTS 3421272 12/1985 Fed. Rep. of Germany ...... 330/277

Primary Examiner—James B Mullins
Attorney, Agent, or Firm—Hopgood, Calimafde, Kalil, Blaustein & Judlowe

[57] ABSTRACT

A MOS cascode operational amplifier stage includes a bias circuit in which one of the bias transistors is operated in its triode region while a second MOS transistor in the output cascode stage is saturated, thereby to achieve a maximum signal output amplitude at the cascode amplifier output stage, which is substantially unaffected and/or optimized by variations in processing parameters.

1 Claim, 1 Drawing Figure

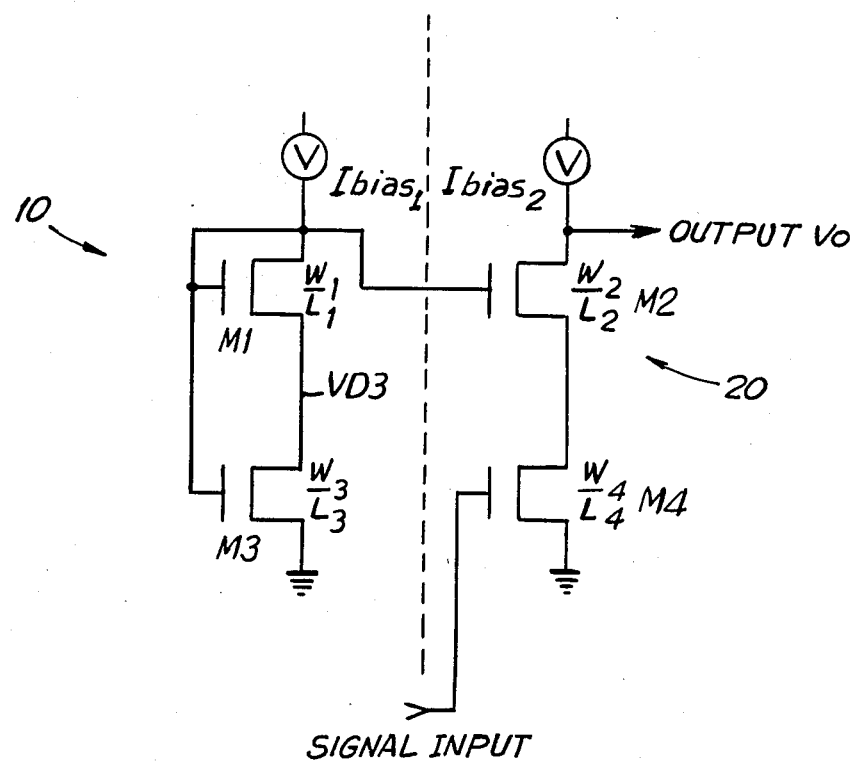

CASCODE AUTO BIAS CIRCUIT

The present invention relates generally to MOS integrated circuits, and more particularly to an improved MOS cascode amplifier stage.

Cascode amplifier stages are used in numerous applications such as in operational amplifiers which require both high gain and high bandwidth response. Cascode amplifiers using MOS devices have been developed with the many advantages that result from the use of MOS technology.

One problem that has been encountered in the use of MOS cascode amplifier stages is that as a result of possible variations in the major MOS processing parameters, such as threshold voltage $V_t$ and transistor gain, it is often difficult to bias the output cascoded transistor so as uniformly to achieve the desired maximum large signal output amplitude at the drain of the output cascoded MOS transistor. The extend of such processing variations may be limited by introducing modifications to the fabrication process but this adds considerably to the cost and complexity of the process employed in the fabrication of these devices. This inability to reliably bias an MOS cascoded amplifier stage has thus far limited the utility of these circuits.

It is therefore an object of the present invention to provide an MOS cascoded amplifier stage in which the output signal level is substantially unaffected by variations in the MOS threshold voltage and is maximized for the different transistor gains across the process.

To this end, the present invention provides a novel bias circuit for an MOS cascode amplifier stage in which the channel width and length of an MOS transistor in the bias circuit are selected such that the drain voltage at one of the bias circuit transistors is substantially equal to the drain voltage at the input cascode MOS transistor at saturation. Under this condition one MOS transistor in the bias circuit is biased to operate in its triode or linear region while an other MOS circuit is saturated.

To the accomplishment of the above and such further objects as may hereinafter appear, the present invention relates to an MOS cascode amplifier substantially as defined in the appended claims and as described in the following specification as considered along with the accompanying FIGURE which is a schematic circuit diagram of an MOS cascode amplifier stage and bias circuit embodying features of the present invention.

As shown in the FIGURE, a bias circuit 10 is provided to establish a bias signal to a cascode amplifier stage 20. In accordance with the invention, as set forth in greater detail below, the bias signal established by bias circuit 10 produces a maximum output signal amplitude at output $V_O$ of amplifier stage 20, which is substantially unaffected by differences in the major MOS processing parameters such as threshold voltage $V_t$ and is automatically optimized across the process spread of transistor gain K.

The bias circuit 10 includes an upper MOS transistor or FET M1 having its gate coupled to its drain and to a current source $T_{bias\,1}$. The source of FET M1 is connected to the drain of a lower MOS FET M3 and the gate of FET M1 is connected to the gate of MOS FET M3. The source of the latter is connected to ground.

The cascode amplifier stage 20, which is per se conventional, includes an upper MOS FET M2 having a drain at which the output signal $V_O$ is presented. The gate of FET M2 is connected to the drain or output of MOS FET M1 and its drain is connected to current source $I_{bias\,2}$. The source of FET M2 is connected to the drain of a lower MOS FET M4, which has its gate receiving an input signal, which is to be amplified, and a source connected to ground.

In accordance with one aspect of this invention, it has been found that by properly establishing the ratio of the source-drain channel width W to the source-drain channel length L of FET M3, or W3/L3, the drain voltage VD3 of FET M3 can be set equal to the drain voltage $V_{DSAT\,M4}$ at saturation of FET M4. When this condition is established, the value of $V_O$, the output of FET M2, can reach its minimum value and will be substantially unaffected by variations in the major MOS process parameter $V_t$. The maximum AC amplitude of voltage $V_o$ will therefore be realizable for different values of transistor gain K. Under this condition, the gate voltage at FET M2 closely tracks variations in the process parameters and FET M3 is operated in its triode or linear region while FET M1 is in saturation.

The operation of this circuit with the result described can be understood and confirmed from the following analysis of the circuit.

The bias voltage $V_{bias}$ of the drain of FET M1 is:

$$V_{bias} = V_{DSATM1} + V_{TM1} + V_{D3} \quad (1)$$

Where
$V_{DSAT\,M1}$ = minimum drain-to-source voltage of MOS FET M1 to operate in saturation.
$V_{TM1}$ = threshold voltage associated with FET M1.
$V_{D3}$ = drain voltage of FET M3.
It is also known that for equal $I_{bias}$ of FET M1 and FET M2, $$V_{DSATM1} = V_{DSATM2} \quad (2)$$

and $$V_{TM1} = V_{TM1} \quad (2A)$$

From equations (2) and (2A) we can obtain:

$$V_{bias} = V_{DSATM2} + V_{TM2} + V_{D3} \quad (3)$$

It is also known that for a maximum output swing of $V_O$, $$V_{OMIN} = V_{DSATM2} + V_{DSATM4} \quad (4)$$

and $$V_{bias} = V_{OMIN} + V_{TM2} \quad (5)$$

In order for FETs M2 and M4 to remain in saturation, from Eqs. (4) and (5) we obtain $$V_{bias} = V_{DSATM2} + V_{TM2} + V_{DSATM4} \quad (6)$$

Equating Eqs. (3) and (6), we obtain:

$$V_{DSATM2} + V_{TM2} + V_{D3} = V_{DSATM2} V_{TM2} V_{DSATM4} \quad (7)$$

Eq. (7) indicates the level of bias voltage needed by the cascade stage 20 to maintain saturation with minimum output voltage swing.
or $$V_{D3} = V_{DSATM4} \quad (8)$$

This relation indicates that the desired value of $V_{bias}$ is established when $V_{D3}$, the drain voltage FET M3 in the bias circuit 10, is equal to the saturation drain voltage of the lower MOS FET M4 in the cascode stage 20. This relationship is established only when FET M3 is operating in its triode or linear region and FET M1 is in saturation.

It has also been determined that relationship (8) can be established by setting a value of the ratio W3/L3 so as to establish $V_{D3}$ at this desired relationship with $V_{DSAT_{M4}}$ by means of the following relationships:

For desired operation $$I_{bias1} = I_D = I_{bias2} \qquad (9)$$

$$I_{bias2} = K'(W4/L4)(V_{DSAT_{M4}})^2 \qquad (10)$$

where M4 and L4 are the width and length of the source-drain channel of FET M4, respectively.

Moreover, $$I_D = B_3 [V_{D3}^2 + 2\sqrt{I_D/B_1}\ V_{D3} + 2\ V_{D3}(\gamma\ [\sqrt{V_{D3} + 2\phi F} - \sqrt{2\phi F}\ )] \qquad (11)$$

where $B_3 = K'W3/L3$, $B_1 = K'W1/L1$, and the multiplier of $\gamma$ is the source-body effect term.

From Eqs. (9), (10) and (11) the ratio of W3/L3 can be derived which will satisfy Eq. (8). It will be observed that Eq. (11) is independent of the process parameter $V_T$ and that the first term on the right-hand side of Eq. (11) dominates. As a result, $V_{D3}^2$ is seen to track $(V_{DSAT_{M4}})^2$ substantially linearly over a varying K' which satisfies the desired bias condition over the major process variations. An analysis of this circuit reveals less than a −8%, +3% error over K' variance of a typical CMOS process.

It will thus be appreciated from the foregoing description of a presently preferred embodiment of the invention that the bias circuit of the invention provides an optimum output signal at a cascode amplifier stage, which is substantially unaffected by variations in processing parameters. It will also be appreciated that modifications may be made in the embodiment hereinabove described without necessarily departing from the spirit and scope of the invention.

What is claimed is:

1. A cascode amplifier including an output amplifier stage and a biasing stage, said output amplifier stage comprising a first field effect transistor having a drain, source and gate, the signal established at the drain of said first field effect transistor constituting the output of the cascode amplifier, and a second field effect transistor having a drain connected to the source of said first field effect transistor and a gate for receiving an input signal, and a grounded source, said biasing stage comprising a third field effect transistor having a drain connected to a bias current source and to the gate of said first field effect transistor, and a fourth field effect transistor having a gate connected to the gate of said third field effect transistor and a drain connected to the source of said third field effect transistor, and a grounded source, the ratio of the source-drain channel width to the source-drain channel length of said fourth field effect transistor being selected such that the drain voltage of said fourth field effect transistor is substantially equal to the minimum drain voltage at saturation of said second field effect transistor, whereby the amplitude of the output signal at the drain of said first field effect transistor is at a maximum value and is substantially unaffected and/or optimized by possible variations in the major parameters of said field effect transistors.

* * * * *